April 17, 1962 G. DERMIT 3,030,557

HIGH FREQUENCY TUNNEL DIODE

Filed Nov. 1, 1960

INVENTOR
GEORGE DERMIT
BY R. J. Frank
ATTORNEY

United States Patent Office 3,030,557

Patented Apr. 17, 1962

3,030,557

HIGH FREQUENCY TUNNEL DIODE

George Dermit, Jackson Heights, N.Y., assignor to General Telephone and Electronics Laboratories, Inc., a corporation of Delaware Filed Nov. 1, 1960, Ser. No. 66,577
6 Claims. (Cl. 317—234)

This invention relates to semiconductor diodes and in particular to a tunnel diode package useful at high frequencies.

The tunnel diode is a semiconductor device consisting of a p-type region and an n- type region, each region having an electrode affixed thereto. Both regions contain very high impurity concentrations and in addition the chemical transition from the n-type to the p-type regions is quite abrupt. Impurity concentrations in tunnel diodes are of the order of $10^{19}$ atoms per cubic centimeter while the thickness of the p-n junction is typically about $10^{-6}$ centimeter. The tunnel diode is normally provided in a package containing the diode, the electrodes and a protective case surrounding the assembly.

The relationship between current and applied voltage for a tunnel diode differs from that found for other types of p-n junction diodes. In the tunnel diode, the current reaches a high peak value $I_p$ when a very low voltage is applied across its electrodes, this current decreasing to a minimum value as the voltage is increased and then rising abruptly with further increases in voltage. As a result, a negative resistance characteristic is obtained which is useful in oscillators as well as in many other electronic circuits.

The frequency of oscillation of a circuit comprising a tunnel diode connected to a given load is determined by the inductance and resistance of the connecting leads as well as by the inductance, junction capacity, negative resistance and series resistance of the diode. The inductance, capacitance and series resistance must be minimized if high frequency operation is to be obtained. In particular, if the frequency $w_r$ at which the resistive component of the tunnel diode impedance passes through zero is greater than the frequency $w_x$ at which the reactive component passes through zero, the frequency $w_x$ will determine the maximum frequency of oscillation. This latter frequency (termed the self-resonant frequency) is dependent upon the lead inductance; the lower the value of lead inductance for a given capacitance, the higher being the self-resonant frequency of a given diode.

Accordingly it is an object of my invention to provide an improved tunnel diode for operation at high frequencies in which the lead inductance has a significantly reduced value.

Another object is to provide a tunnel diode package having considerable rigidity wherein the displacement of the lead-in members in a direction normal to the surface of the semiconductor block is minimized.

Still another object is to provide a tunnel diode package suitable for use as a high frequency oscillator having a relatively low time constant and low peak current.

A further object is to provide a tunnel diode package in which the lead-in members do not exert a rotational torque on the diode elements.

In accordance with the present invention, a tunnel diode package is provided comprising a highly doped semiconductor wafer having a metallic dot alloyed into its surface to form a narrow p-n junction between the two materials. Electrical contact is made to the dot by a conductive bridge member having a centrally located contact portion. The contact portion bears against the metallic dot and is supported by at least two lead-in arms fastened to a fixed support structure surrounding the semiconductor wafer. The arms supporting the contact portion of the conductive member are symmetrically disposed about an axis passing through the center of the metallic dot in a direction normal to the surface of the wafer.

Since more than one lead-in arm is provided, the total inductance which the arms introduce in series with the diode is considerably less than that obtained when only one lead-in conductor, or arm, is provided. Also, since the lead-in arms are symmetrically disposed about the metallic dot, the angular torque exerted on the dot is essentially zero.

In addition, the symmetrical arrangement of the lead-in arms assures that variations in the force exerted on the metallic dot in a direction along the aforementioned axis are minimized. This is in contrast with known tunnel diode package configurations wherein a single cantilevered lead-in conductor is used to contact the metallic dot thereby tending to produce rotational torques and relatively large vertical displacements of the conductor with changes in temperature or other disturbances.

Another advantage obtained from the present invention is that the rigid support provided by the bridge member permits the junction to be etched to quite small diameters of the order of 0.0001 inch. Junctions of this size, while fragile, are required if high frequency oscillation is to be realized.

In one embodiment of the invention, the conductive bridge member comprises a disc having a depressed central portion consisting of two oppositely located arms attached to the ends of a contact strip. The surface of the contact strip is parallel to the surface of the disc and is supported below it by the two arms. The disc is supported along its outer edge by a support member which surrounds the semiconductor wafer, the height of the support member and the dimensions of the disc being selected to permit the contact strip to make good electrical contact with the metallic dot alloyed to the semiconductor wafer.

Another form of the invention utilizes a conductive bridge having four symmetrically placed arms, the lead-in inductance decreasing as the number of arms supporting the contact strip is increased.

In still another embodiment of the invention a layer of insulating plastic is placed over the diode after the conductive bridge is in place and the package then filled with a conducting paste or cement. With this structure the lead inductance of the tunnel diode package is extremely low since current can flow in all directions from the metallic dot.

The above objects of and the brief introduction to the present invention will be more fully understood and further objects and advantages will become apparent from a study of the following description in connection with the drawings, wherein.

Figure 1:
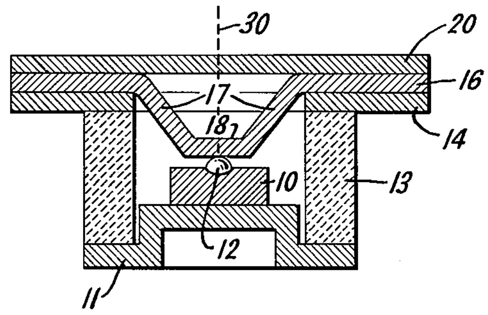
FIG. 1 is a cross-sectional view in elevation of one form of a tunnel diode package employing a conductive bridge having two arms.

Referring to FIG. 1, there is shown a tunnel diode package having a wafer 10 of highly doped n-type germanium with an impurity concentration of approximately $10^{19}$ to $4\times10^{20}$ atoms per cubic centimeter and a resistivity of from .001 ohm-cm. to as low as 0.0004 ohm-cm. The wafer 10, which is bonded to a conductive plate 11 by a suitable gold or lead-tin antimony solder, is made preferably of Kovar, an alloy of nickel, cobalt, and iron. Plate 11 acts as one electrode of the package while, at the same time, protecting germanium wafer 10 from possible damage. An indium dot 12 is alloyed into the center of the germanium wafer 10 to form a p-n junction by a conventional alloying technique in which the wafer 10 and dot 12 are heated rapidly to a temperature of about 500° C. and then rapidly cooled.

A cylindrical support member 13, composed of an insulating material, such as alumina ceramic, is brazed to the plate 11 and a Kovar ring 14 is brazed to the upper end of the support member 13.

A Kovar bridge member 15 (see FIG. 2), comprising a disc portion 16 and two arms 17 attached to the ends of a contact strip 18, is next welded on to ring 14. Contact strip 18 must make good electrical contact with the top of the indium dot 12 and this may be assured by grinding away a suitable amount of the top surface of ring 14 prior to welding bridge member 15.

An alternate method of securing contact between dot 12 and bridge 15 consists of prefabricating a series of bridges 15 with accurately spaced contact strips 18. By starting with the shallowest bridge 15, which has its contact strip 18 closest to its disc 16, and progressively using deeper bridges 15 contact may be established. Calculated practical tolerances are such that this method of contacting can be achieved with a maximum of four trials making it suitable for mass production of diode packages.

The next step in the assembly of the low inductance package is to etch the germanium away from the indium dot 12 by conventional techniques until a junction of the desired area is obtained. The junction area may be about 0.0001 inch in diameter, the desired area for a particular diode being determined from measurements of the diode capacitance and peak current.

After etching, the diode is encapsulated in an epoxy resin and a Kovar top electrode 20 welded to the bridge 15.

It shall be noted that with this construction current flow is established from the conductive plate 11, through the germanium wafer 10, from the indium dot 12 through the two arms 17 and to the top electrode 20. Since the current can take two paths (arms 17), the inductance is approximately half of that obtained when a single cantilevered arm is provided. Also, since the horizontal forces acting on the contact strip 18 are balanced, there can be no rotational torques exerted on the indium dot, nor can there be a vertical displacement as a result of such rotation. It can be seen that with a junction diameter of about 0.0001 inch, the minimizing of such forces on the indium dot is highly desirable. Also, the pressure exerted by the bridge 15 on the indium dot 12 during the etching process simplifies holding this extremely small element firmly in place.

In addition, the time constant of the junction is inversely proportional to the peak current to capacitance ratio $I_P/C$ of the diode, a high $I_P/C$ ratio and a relatively low peak current $I_P$ being required to maintain oscillation. Using a bridge member having two arms, it has been found that with an $I_P/C$ ratio of 4 milliamperes per micromicrofarad the junction can be etched to provide peak currents of about 3 to 5 milliamperes. This is in contrast with known diodes of the cantilevered construction in which reductions in peak current below 50 milliamperes are extremely difficult to obtain efficiently. Tunnel diodes packaged in the manner shown in FIG. 1 have been operated at frequencies exceeding 10,000 megacycles per second.

Figure 2:
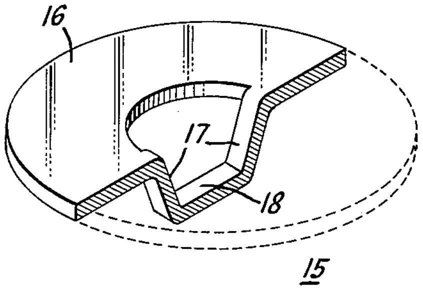
FIG. 2 is a sectional perspective view of the bridge member shown in the device of FIG. 1.
Figure 3:
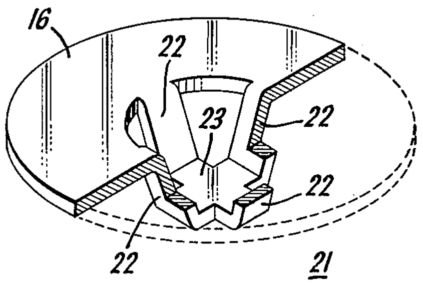
FIG. 3 is a sectional perspective view of a bridge member having four conductive lead-in arms.

In FIG. 3, there is shown a view of a bridge member 21 having two pairs of opposite symmetrically placed arms 22 supporting a contact section 23. This construction permits a still lower inductance to be obtained since the number of current paths obtained are twice those provided by the bridge member 15 of FIG. 2.

Figure 4:
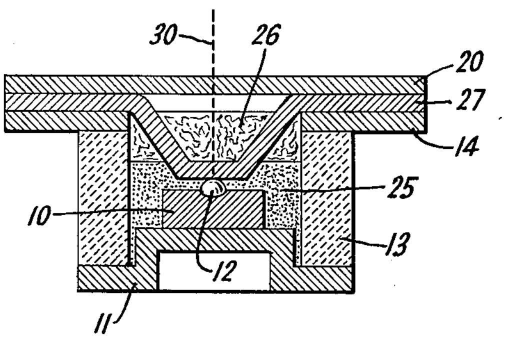
FIG. 4 is a cross-sectional view in elevation of an embodiment of the invention in which conducting cement surrounds the conductive bridge.

FIG. 4 shows a cross sectional view of an embodiment of the invention in which a layer of an insulating plastic 25, such as a low loss epoxy resin, is placed over the surface of the germanium wafer 10 and indium dot 12 after the etching process has been completed. The package is then filled with a conducting silver cement 26 and the top electrode 20 welded to the bridge member 27. With this configuration a still lower lead inductance is obtained than when the conducting cement 26 is omitted. Bridge member 27 may be of the type having two arms as shown in FIG. 2, four arms as in FIG. 3, or may have any number of arms greater than one, so long as they are symmetrically disposed about the axis 30 (FIGS. 1 and 4) passing through the indium dot 12 in a direction normal to the semiconductor wafer 10.

As many changes could be made in the above construction and many different embodiments could be made without departing from the scope thereof, it is intended that all matter contained in the above description or shown in the accompanying drawings shall be interpreted as illustrative and not in a limiting sense.

What is claimed is:

1. A tunnel diode package comprising a semi-conductor wafer, a metallic element alloyed to the surface of said semiconductor wafer, fixed support means, and an electrically conductive member including a contact portion bearing against said metallic element, said conductive member further including first and second pairs of coplanar oppositely positioned arm portions extending outward from said contact portion, said arm portions being attached to said support means and symmetrically disposed about an axis passing through the center of said metallic element in a direction normal to the surface of said semiconductor wafer, the plane through said first pair of arm portions being angularly displaced with respect to the plane through said second pair of arm portions.

2. In a tunnel diode package including a semi-conductor wafer having a metallic dot alloyed thereto and cylindrical support means surrounding said wafer, the upper end of said support means extending above said metallic dot, a conductive bridge member comprising a disc portion affixed to the upper end of said support means, a contact strip positioned parallel to said disc portion and in electrical contact with said metallic dot, and a plurality of arms symmetrically disposed about said disc joining said contact strip to said disc portion.

3. In a tunnel diode package including a semi-conductor wafer having a metallic dot alloyed thereto and cylindrical support means surrounding said wafer, the upper end of said support means extending above said metallic dot, a conductive bridge member comprising a disc portion affixed to the upper end of said support means, a contact strip positioned parallel to said disc portion and in electrical contact with said metallic dot, and a pair of oppositely located arms connecting said contact strip to said disc portion.

4. A tunnel diode package comprising a conductive base member, a semiconductor wafer affixed to said base member, a metallic dot alloyed to said semiconductor wafer, cylindrical support means surrounding said semiconductor wafer, electrically conductive bridge means having a contact portion bearing against said metallic dot and a plurality of arms extending between said contact portion and said support means, and a conductive mass filling the volume surrounded by said support means, said conductive mass being separated from said semiconductor wafer by an insulating layer.

5. The tunnel diode package defined in claim 4 wherein said conductive mass comprises silver cement.

6. In a tunnel diode package including a semiconductor wafer having a metallic dot alloyed thereto and cylindrical support means surrounding said wafer, the upper end of said support means extending above said metallic dot, a conductive bridge member comprising a disc portion affixed to the upper end of said support means, a contact strip positioned parallel to said disc portion and in electrical contact with said metallic dot, and first, second, third and fourth arms connecting said contact strip to said disc portion, said first and second arms being at opposite ends of said contact strip and said third and fourth arms being opposite each other at points intermediate said first and second arms.

References Cited in the file of this patent

UNITED STATES PATENTS

| | | |
|---|---|---|
| 2,852,723 | Escoffery | Sept. 16, 1958 |
| 2,897,419 | Howland et al. | July 28, 1959 |